United States Patent [19]

Shimizume et al.

[11] Patent Number: 4,821,293

[45] Date of Patent: Apr. 11, 1989

[54] DIGITAL PHASE LOCKED LOOP CIRCUIT

[75] Inventors: Kazutoshi Shimizume; Mutsumi Kimura, both of Kanagawa, Japan

[73] Assignee: Sony Corporation, Tokyo, Japan

[21] Appl. No.: 192,653

[22] Filed: May 11, 1988

[30] Foreign Application Priority Data

May 20, 1987 [JP] Japan .................. 62-123491

[51] Int. Cl.$^4$ ............................. H03K 5/135
[52] U.S. Cl. ...................... 375/81; 331/14; 328/155; 360/43
[58] Field of Search .............. 375/81, 119, 120; 360/43, 51; 328/72, 155; 331/1 R, 1 A, 14

[56] References Cited

U.S. PATENT DOCUMENTS 4,493,094  1/1985  Thomson .................. 328/155

Primary Examiner—Benedict V. Safourek

[57] ABSTRACT

A digital phase locked loop (PLL) circuit having an input terminal to which an input digital signal is supplied, a counter for counting a reference clock, a digital phase comparator for comparing the phases of the input digital signal and the output of the counter, a digital low-pass filter supplied with the output of the digital phase comparator, a correction control signal generating circuit and a control circuit, whereby the quantization error is reduced to improve the follow-up characteristic of the digital PLL circuit. Also, the digital PLL circuit contains no residual phase error and this highly-stable digital PLL circuit is arranged so as not to respond to a high frequency fluctuation component such as a peak shift.

13 Claims, 14 Drawing Sheets

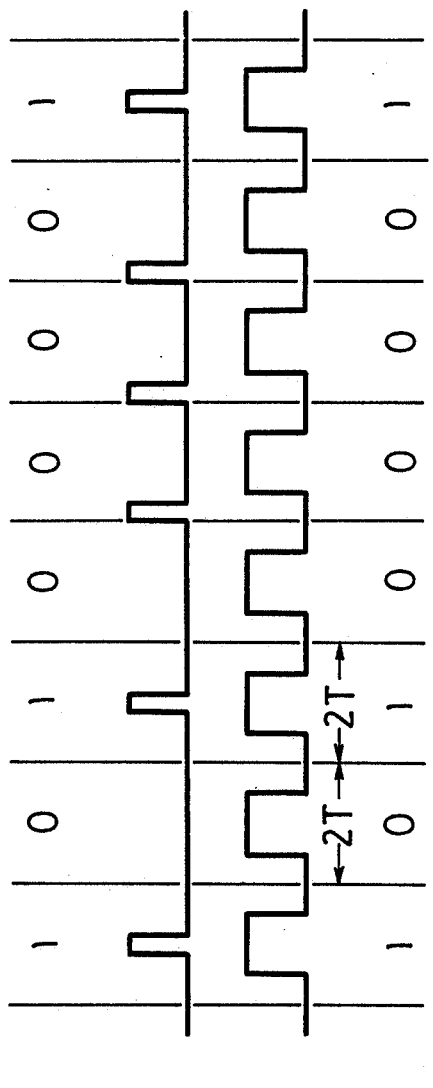
FIG. 1A
FIG. 1B
FIG. 1C
FIG. 1D
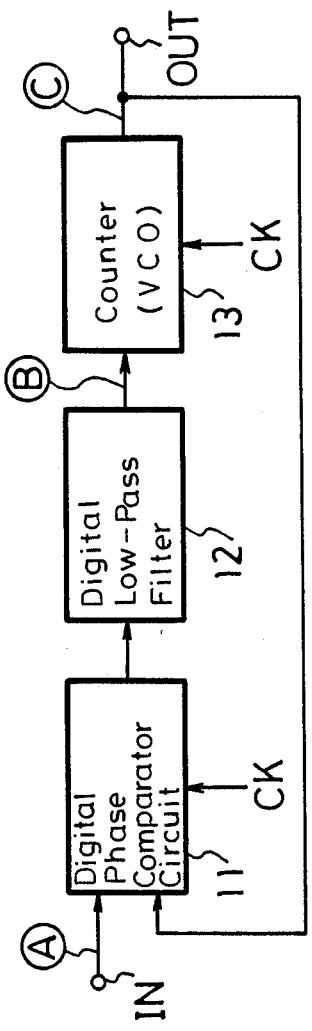
FIG. 2

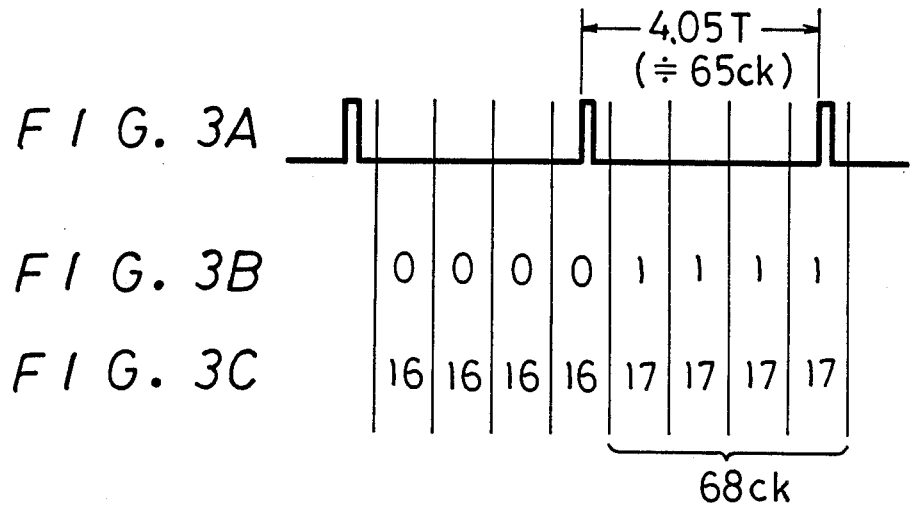
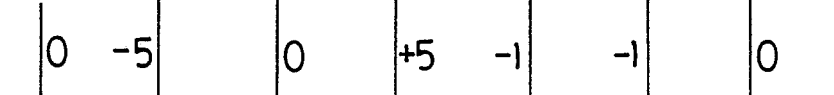
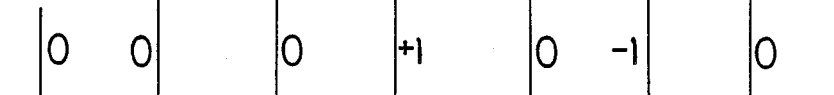
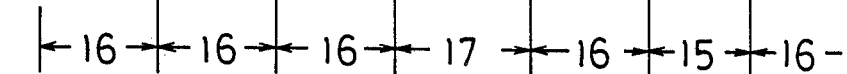

FIG. 5
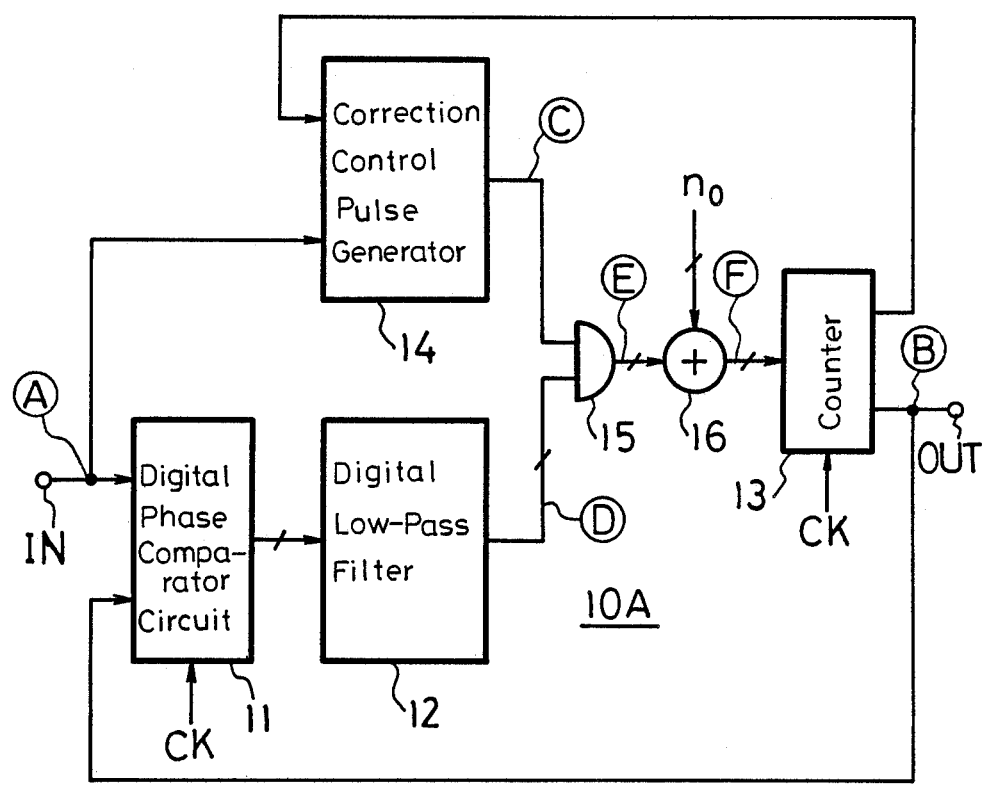
FIG. 7A
FIG. 7B
FIG. 7C
FIG. 7D
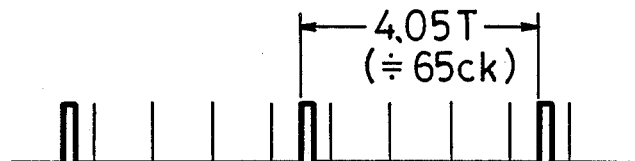

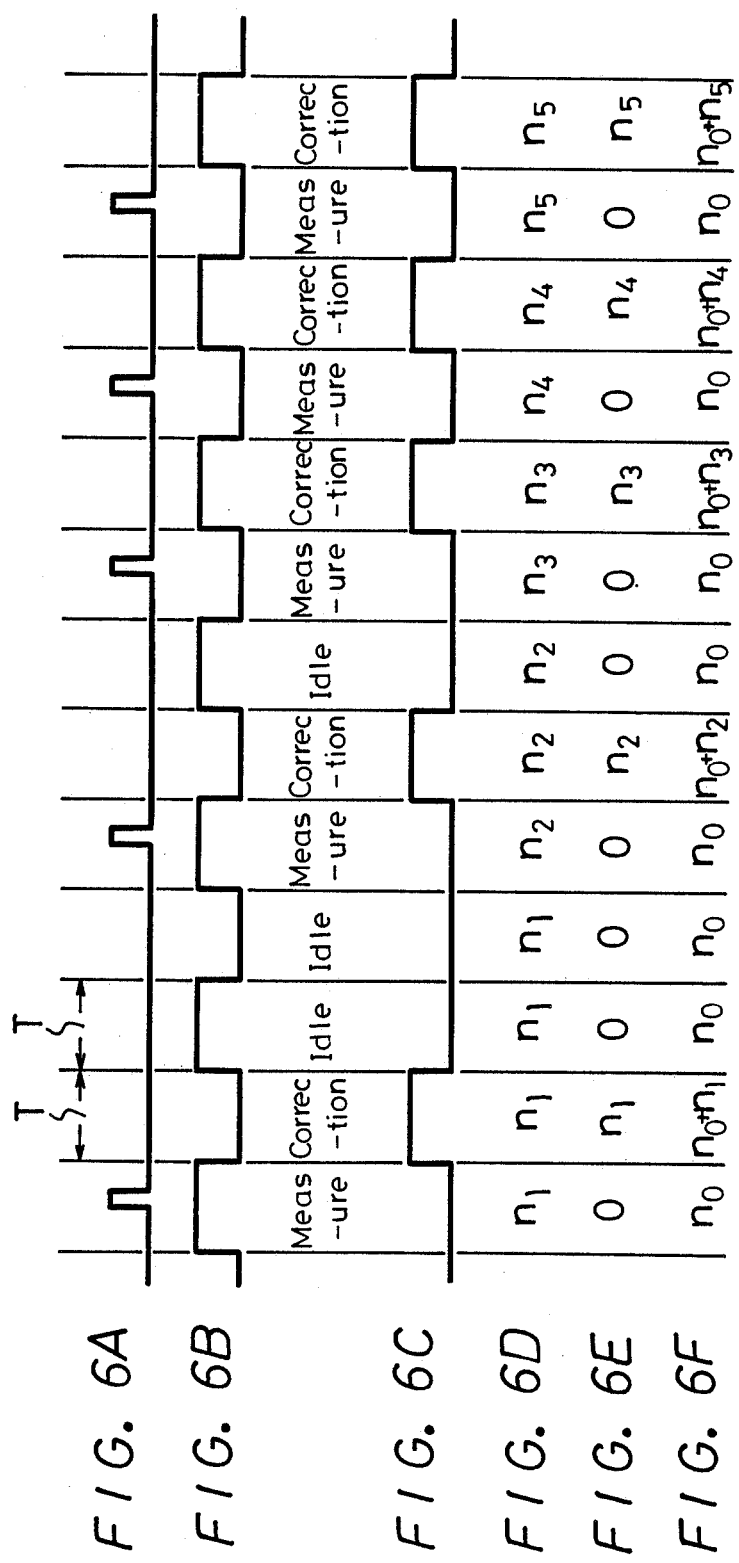

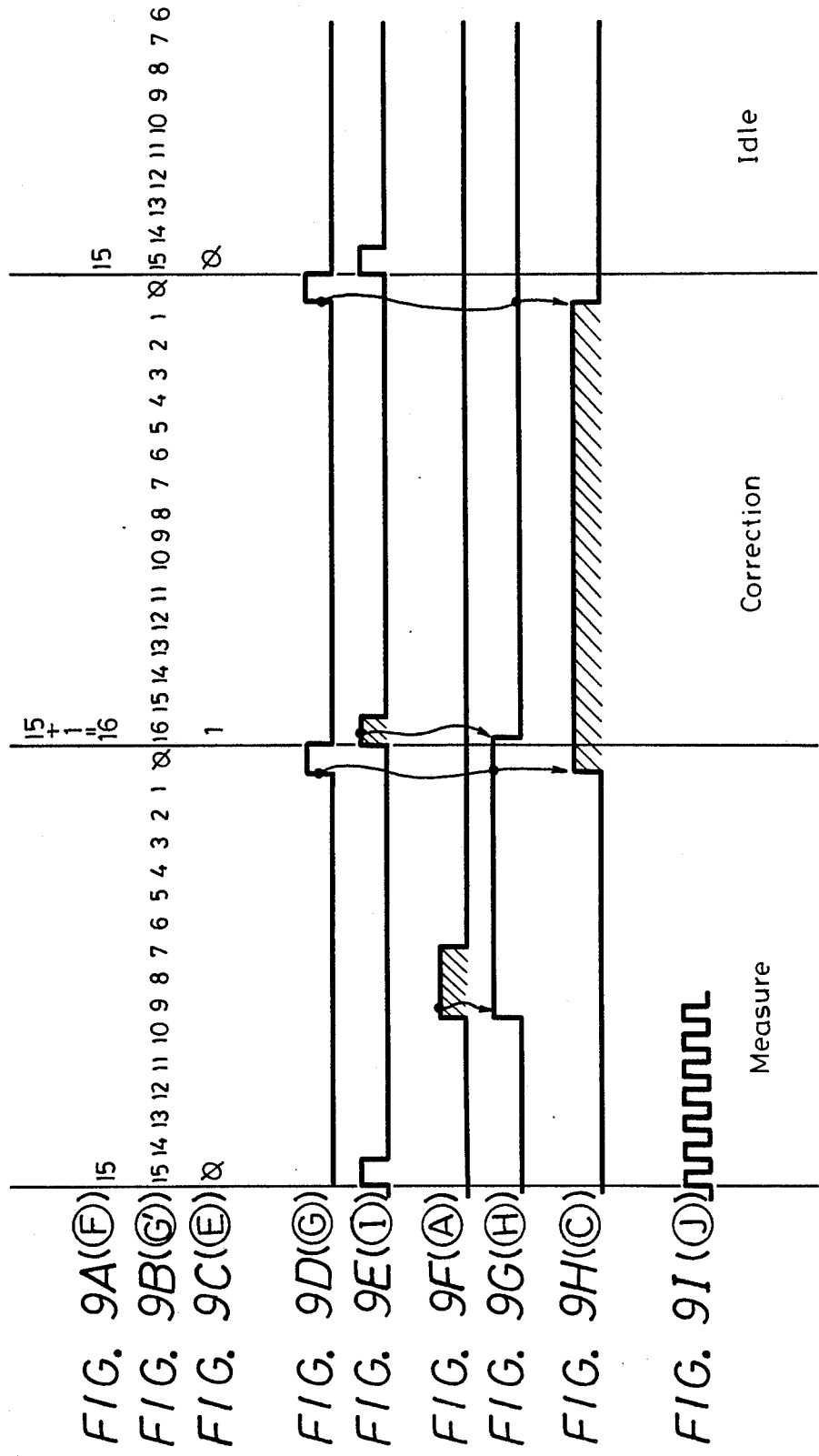

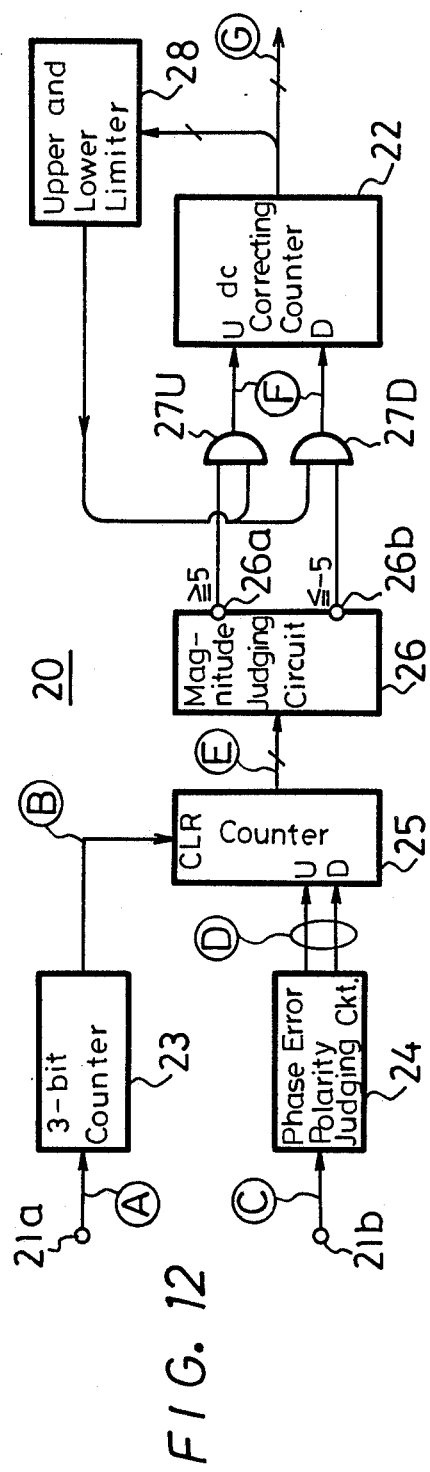
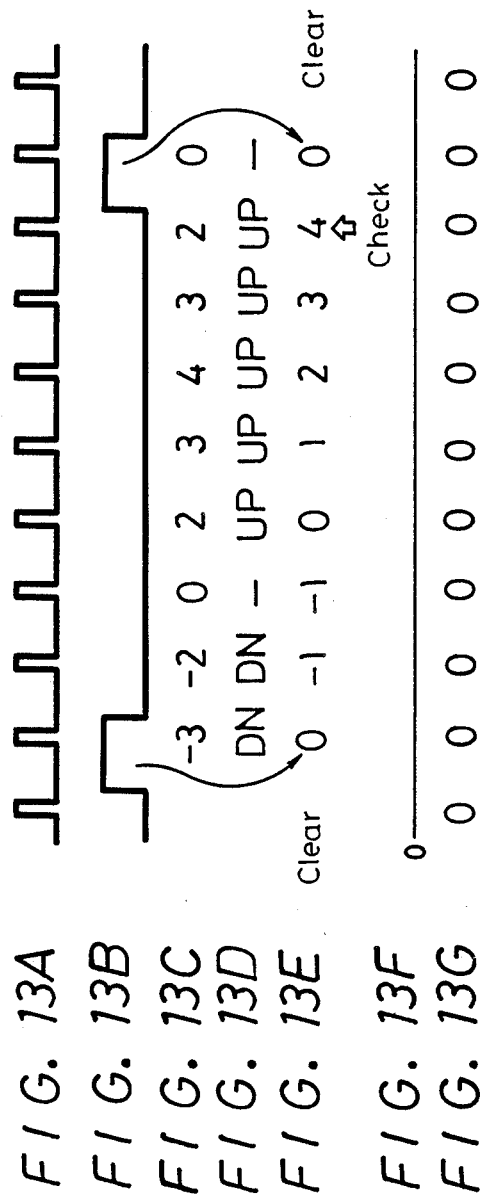
FIG. 12
FIG. 13A
FIG. 13B
FIG. 13C
FIG. 13D
FIG. 13E
FIG. 13F
FIG. 13G

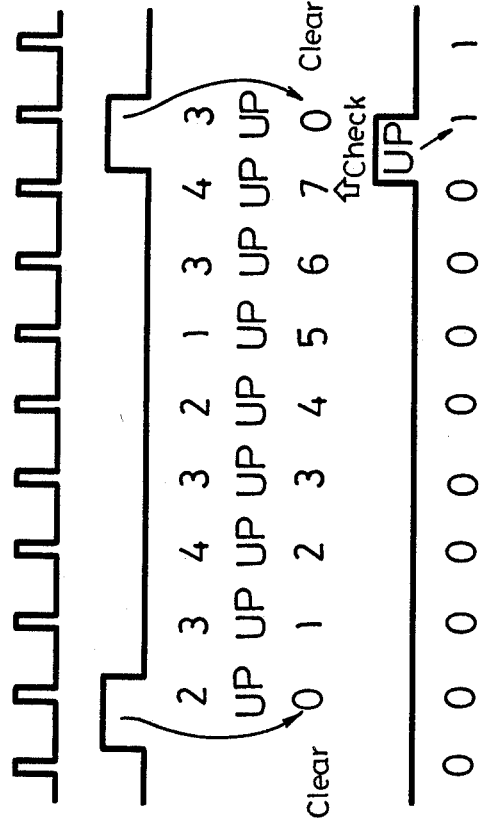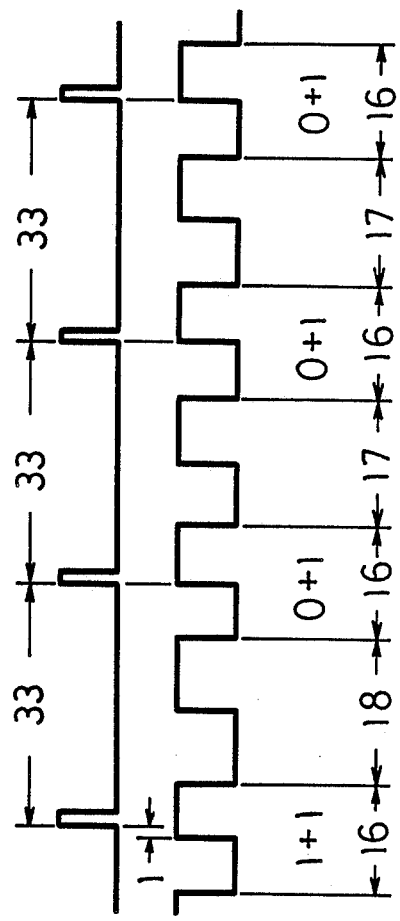
FIG. 14A
FIG. 14B
FIG. 14C
FIG. 14D
FIG. 14E
FIG. 14F
FIG. 14G
FIG. 15A
FIG. 15B
FIG. 15C
FIG. 15D

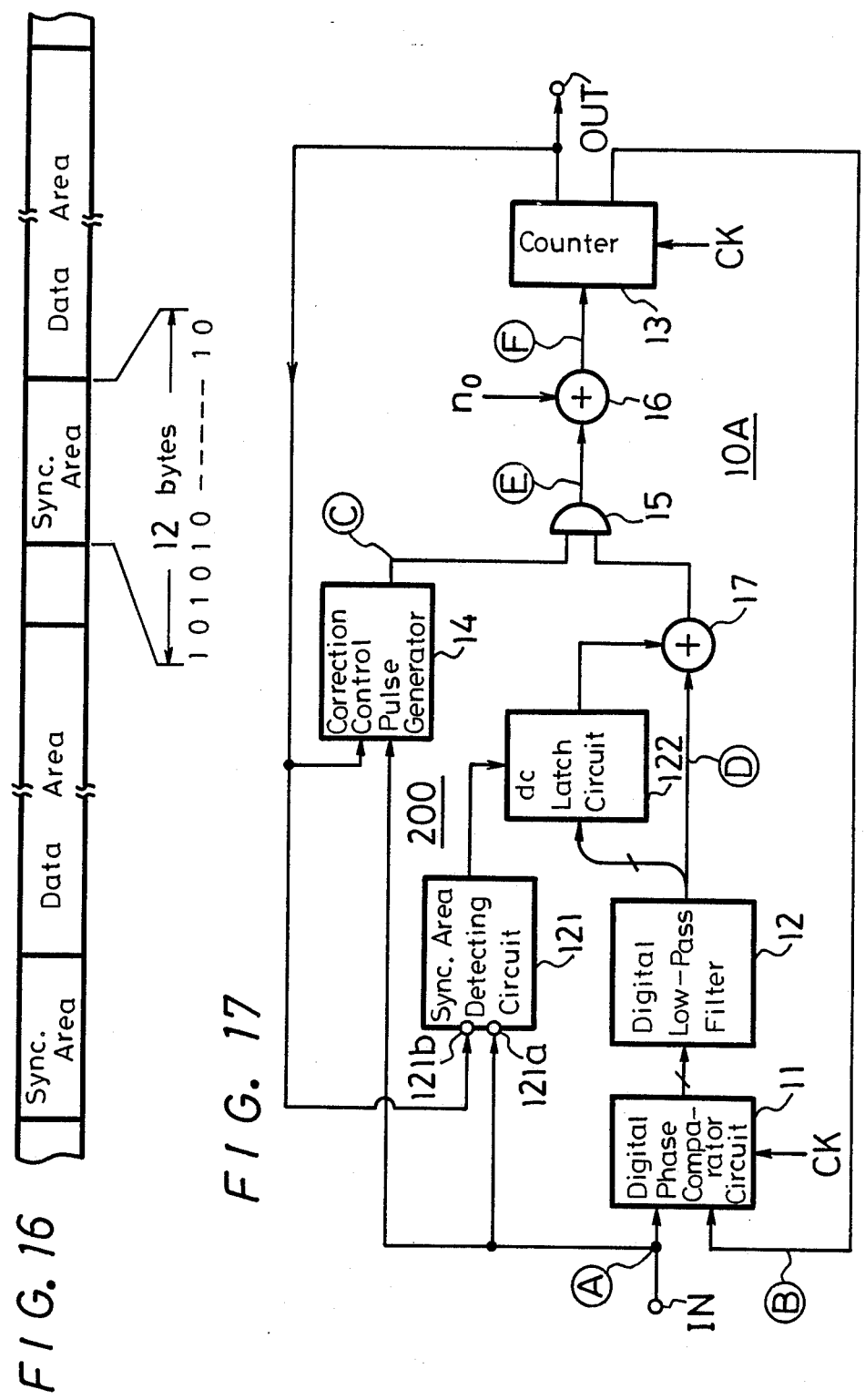
F I G. 16
F I G. 17

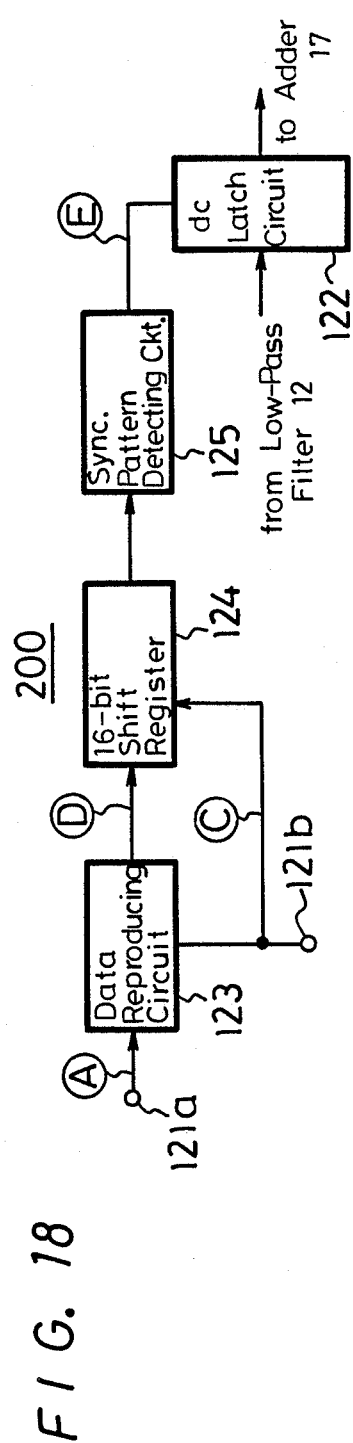
FIG. 18
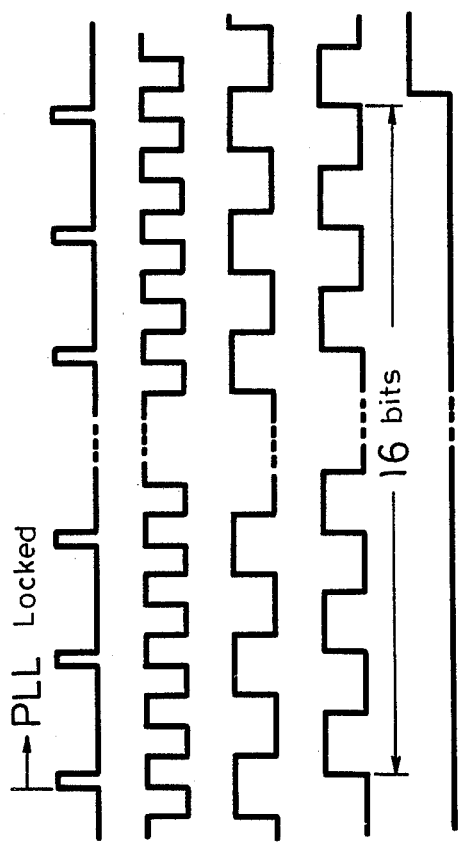
FIG. 19A
FIG. 19B
FIG. 19C
FIG. 19D
FIG. 19E

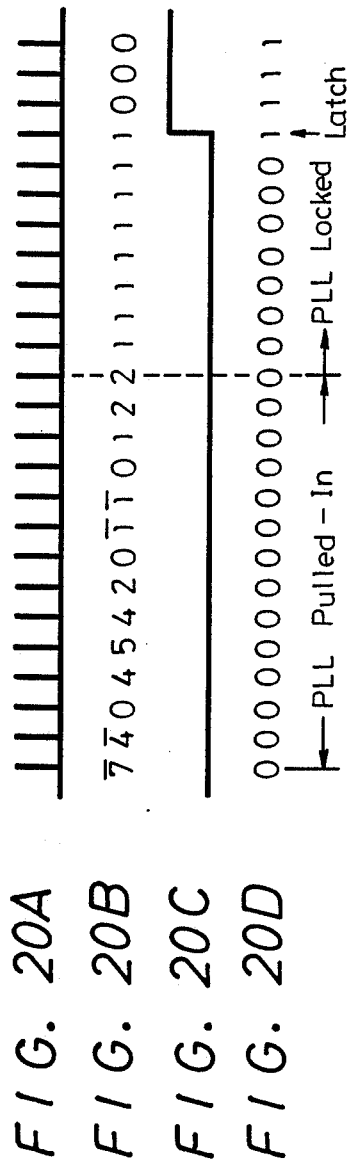
FIG. 20A
FIG. 20B
FIG. 20C
FIG. 20D
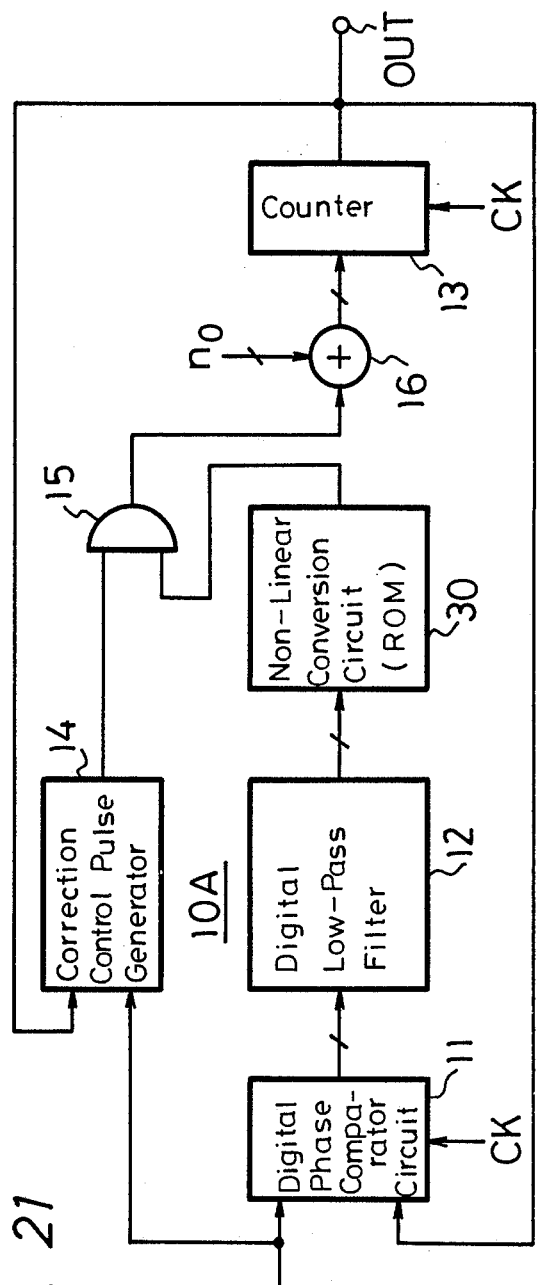
FIG. 21

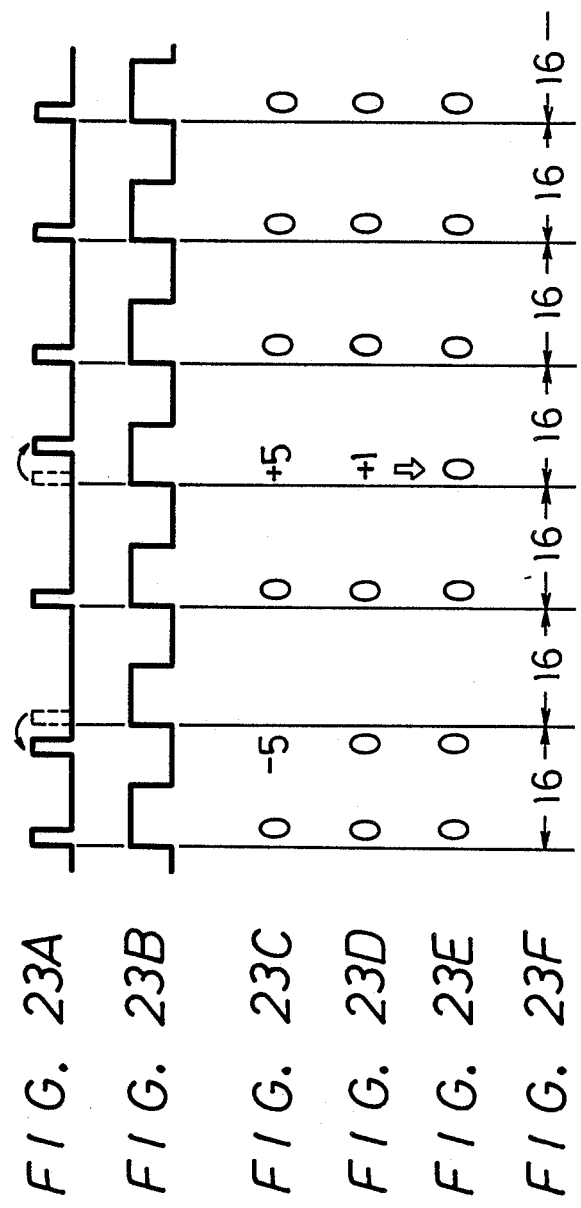

DIGITAL PHASE LOCKED LOOP CIRCUIT

BACKGROUND OF THE INVENTION

1. Field of the Invention

The present invention relates generally to digital phase locked loop circuits and more particularly, is directed to a digital phase locked loop circuit for use in a demodulating circuit which demodulates data reproduced from a floppy disk or the like.

2. Description of the Prior Art

When data shown in FIG. 1A is written on a floppy disk according to the recording system with double density recording, data is modified-frequency-modulated (MFM) as shown in FIG. 1B and then recorded on the flopy disk. T assumes a time between data bits. Then, the pulse interval of the MFM-modulated data is represented as one of 2T, 3T or 4T.

When data is read out of the floppy disk, a window signal indicating the section between the adjacent bits as shown in FIG. 1C is formed from the MFM-modulated pulse by which the MFM-modulated data is demodulated to produce reproduced data shown in FIG. 1D.

The circuit for generating the window signal is called a data separator circuit or variable frequency oscillator (VFO) circuit. In most cases of the MFM recording, the window signal generating circuit is formed of an analog phase locked loop circuit.

Though fabricated as an integrated circuit (IC), the analog phase locked loop circuit (hereinafter simply referred to as a PLL circuit) has to connect a resistor and a capacitor to the outside of the integrated circuit. This increases the number of external connection pins for the integrated circuit inevitably. Further, the analog PLL circuit needs a proper adjustment and its temperature characteristic is not satisfactory.

To remove the above-mentioned defects, there is a known digital PL circuit shown in FIG. 2. This conventional digital PLL circuit will be described hereinafter with reference to FIG. 2.

As FIG. 2 shows, there is shown a PLL circuit 10 which comprises a digital phase comparator circuit 11, a digital low-pass filter 12 and a counter 13. The counter 13 frequency-divides a clock CK supplied thereto from a clock generator circuit or crystal oscillator (not shown) and changes its frequency-divided value so as to function as a voltage controlled oscillator (VCO). The repetitive cycle of the clock CK is selected as, by way of example, T/16.

Data reproduced from the floppy disk, however, contains a jitter component caused by the irregular revolution of a drive motor, an extraneous noise component or the like so that when data bit and clock bit are separated from, for example, MFM-modulated data, quantization error or sampling error of the digital PLL circuit raises a serious problem.

When an incoming data having a pulse interval, 4.05T ($\approx$65 clock cycles) shown in FIG. 3A is supplied to the conventional digital PLL circuit 10 shown in FIG. 2, the output from the digital low-pass filter 12 changes from [0] to [1] as shown in FIG. 3B so that as shown in FIG. 3C, the count value (frequency-dividing ratio) of the counter 13 changes from [16] to [17]. Thus, the pulse interval, 4.05T of the input data is regarded as $17 \times 4 = 68$ clock cycles.

In this state, the pulse interval of the input data becomes shorter than 4 cycles of the output from the counter 13 and thus the output from the digital phase comparator circuit 11 tends to become negative. However, the digital low-pass filter 12 is arranged so as not to follow the afore-mentioned rapid change so that after a predetermined period in which the counter 13 holds its count value, [17], the counter 13 changes its count value from [17] to [16]. If the counter 13 holds this count value, i.e., [16] during a predetermined period, the 4 periods of the output from the counter 13 is presented as $16 \times 4 = 64$ clock cycles which are shorter than the practical pulse interval of the input data, i.e, 65 clock cycles. Thus, the output from the digital phase comparator circuit 11 is gradually returned to be positive and then inverted to be positive at a certain time point. After the lapse of the predetermined time period, the output from the digital low-pass filter 12 changes from [0] to [1] so that the counter 13 produces the count value, [17] again.

Since the conventional digital PLL circuit cannot avoid the sampling error as described above, a follow-up characteristic for input data of the digital PLL circuit is inferior as compared with that of the analog PLL circuit.

In general, data reproduced from the floppy disk contains a frequency fluctuation component of relatively low frequency caused by the irregular revolution of the drive motor and so on. Also, when data written in the floppy disk has a particular bit pattern, mutual interference of data pulse causes the position of pulse to be shifted, thus producing a frequency fluctuation component of high frequency which might be called a peak shift.

Therefore, the digital PLL circuit has to follow the low frequency fluctuation component satisfactorily and must not follow the so-called peak shift so as to read the data erroneously. In order to realize the afore-mentioned characteristics, the cutoff frequency of the digital low-pass filter 12 is selected, for example, to be 10 kHz.

Accordingly, when incoming data having frequency fluctuation component sufficiently higher than the cutoff frequency of the digital low-pass filter 12, i.e., peak-shifted data is applied to an input terminal IN of the PLL circuit 10 shown in FIG. 2, the output from the phase comparator circuit 11 changes in response to this quick fluctuation while the output from the digital low-pass filter 12 should become [0] inherently. However, due to the measuring error of the digital low-pass filter 12, the above output does not become [0] and there may appear an output signal.

When input Ⓐ data having high frequency fluctuation component due to the peak shift phenomenon as, for example, shown in FIG. 4A is supplied to the input terminal IN of the PLL circuit 10, the output, which changes as [0], [−5], [0] and [+5], from the digital phase comparator circuit 11 is supplied to the digital low-pass filter 12. As mentioned before, the digital low-pass filter 12 is not responsive to the high frequency so that the output thereof should become [0]. However, due to the measuring error thereof, at time point in which the phase error, [+5] is inputted to the digital low-pass filter 12, [+1] appears as the output of the digital low-pass filter 12 as shown in FIG. 4D. As a result, as shown in FIG. 4E, the frequency-divided value of the counter 13 changes from [16] to [17] and hence the digital PLL circuit 10 follows the peak shift. Thus, as shown in FIG. 4C, the phase error remains in several input data.

Because of the above-mentioned measuring error, as compared with the analog PLL circuit, the conventional digital PLL circuit is not stable for input data containing peak shift component.

OBJECTS AND SUMMARY OF THE INVENTION

Accordingly, it is an object of the present invention to provide an improved digital phase locked loop circuit which can obviate the above-mentioned defects of the prior art.

Another object of the present invention is to provide a digital phase locked loop circuit which reduces quantization error and improves the follow-up characteristic thereof.

A further object of the present invention is to provide a digital phase locked loop circuit which has no residual phase error.

A still further object of the present invention is to provide a digital phase locked loop circuit which is not responsive to a high frequency fluctuation component such as a peak shift or the like and high in stability.

According to an aspect of the present invention, there is provided a digital phase locked loop (PLL) circuit comprising:

(a) input digital signal source means for generating an input digital signal having a pulse occurring at an integral multiple of a unit period;

(b) counter means for counting the number of a reference clock;

(c) digital phase comparator means for comparing phases of said input digital signal and the output of said counter means;

(d) digital low-pass filter means supplied with the output of said digital phase comparator means;

(e) correction control signal generating means for generating a correction control signal occurring at a following unit period of a unit period during which the pulse of said input digital signal occurs; and (f) control means in response to said correction control signal for supplying the output of said digital low-pass filter means to said counter means to control the dividing ratio of said counter means only in the unit period during which said correction control signal is obtained.

The above, and other objects, features and advantages of the present invention will become apparent from the following detailed description of the preferred embodiments to be taken in conjunction with the accompanying drawings, throughout which like reference numerals identify the same or similar parts.

BRIEF DESCRIPTION OF THE DRAWINGS

FIGS. 1A to 1D are timing charts respectively used to explain the operation of the present invention;

FIG. 2 is a block diagram showing an example of a conventional digital phase locked loop circuit;

FIGS. 3A to 3C and FIGS. 4A to 4E are timing charts respectively used to explain the operation of the example of the conventional digital phase locked loop circuit of FIG. 2;

FIG. 5 is a block diagram showing an embodiment of a digital phase locked loop circuit according to the present invention;

FIGS. 6A to 6F and FIGS. 7A to 7D are timing charts respectively used to explain the operation of the embodiment shown in FIG. 5;

FIGS. 9A to 9I are timing charts respectively used to explain the operation of the correction control pulse generator circuit shown in FIG. 8;

FIG. 12 is a block diagram showing an arrangement of a dc correcting circuit used in the second embodiment of FIG. 11;

FIGS. 13A to 13G, FIGS. 14A to 14G and FIGS. 15A to 15D are timing charts,, respectively used to explain the operation of the second embodiment shown in FIG. 11;

FIG. 16 is a schematic representation illustrating an arrangement of incoming data;

FIG. 17 is a block diagram showing a third embodiment of the digital phase locked loop circuit according to the present invention;

FIG. 18 is a block diagram showing an arrangement of a dc correcting circuit used in the third embodiment of FIG. 17;

FIGS. 19A to 19E and FIGS. 20A to 20D are timing charts respectively used to explain the operation of the third embodiment shown in FIG. 17;

FIG. 21 is a block diagram showing a fourth embodiment of the digital phase locked loop circuit according to the present invention;

FIGS. 23A to 23F are timing charts respectively used to explain the operation of the fourth embodiment of the present invention.

DETAILED DESCRIPTION OF THE PREFERRED EMBODIMENTS

Figure 8:
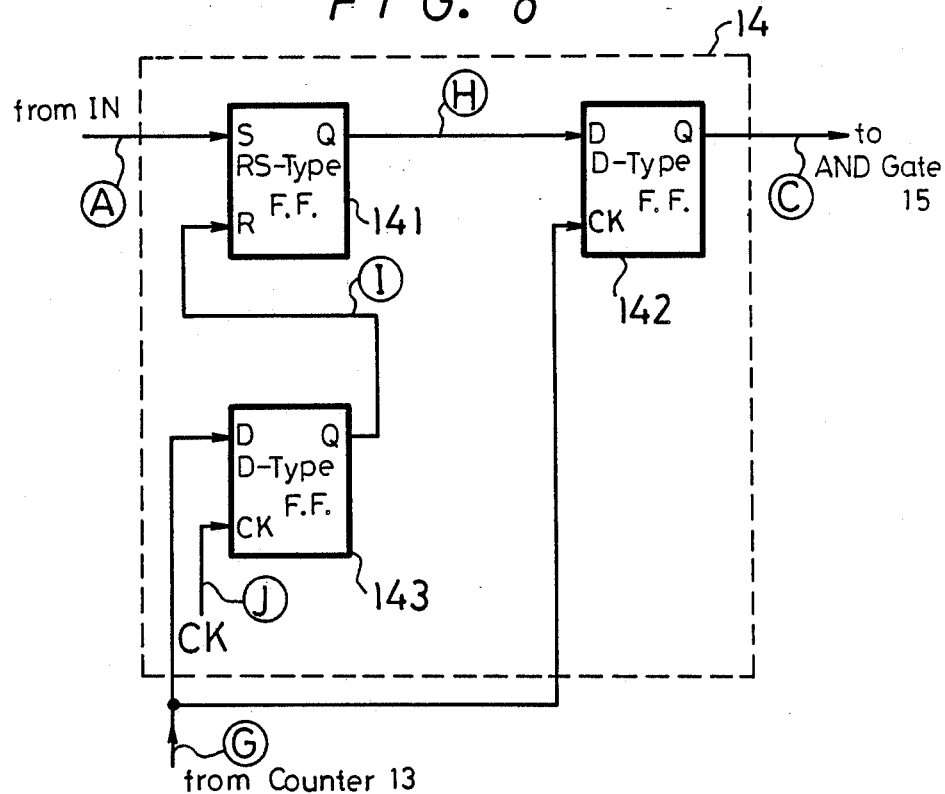
FIG. 8 is a block diagram showing an arrangement of a correction control pulse generator circuit used in the digital phase locked loop circuit of the present invention shown in FIG. 5.

The present invention will now be described with reference to the drawings. FIG. 5 illustrates a circuit arrangement of an embodiment of a digital phase locked loop circuit according to the present invention. In FIG. 5, like parts corresponding to those of FIG. 2 are marked with the same references and therefore need not be described in detail.

Referring to FIG. 5, there is provided a digital PLL circuit 10A of the invention in which the incoming data at the input terminal IN is supplied to the digital phase comparator circuit 11 and a correction control pulse generator circuit 14. The output from the correction control pulse generator circuit 14 and the output from the digital low-pass filter 12 are supplied to an AND gate 15. The output from the AND gate 15 is supplied to the counter 13 through an adder 16. To the adder 16, there is supplied a frequency-divided value $n_0$ (=16) of center frequency in order that the output from the counter 13 becomes the center frequency in the absence of input data. The output from the counter 13 is supplied to the phase comparing circuit 11 and to the correction control pulse generator circuit 14.

The operation of this embodiment shown in FIG. 5 will be described next.

When input data Ⓐ having a fundamental period T as shown in FIG. 6A is supplied to the digital PLL circuit 10A, the digital phase comparator circuit 11 measures a phase difference between the input data Ⓐ and the output (window pulse) Ⓑ of the counter 13. Then, on the basis of the measured phase difference, an output [$n_1$] or Ⓓ (shown in FIG. 6D) from the digital low-pass filter 12 is supplied to one input terminal of the AND gate 15. The AND gate 15 receives at the other input terminal thereof a correction control pulse Ⓒ (shown in FIG. 6C) from the correction control pulse generator circuit 14. Since this correction control pulse Ⓒ is at low level "Lo" in the first half cycle (fundamental period) of the window pulse Ⓑ, the output Ⓔ from the AND gate 15 becomes [0] as shown in FIG. 6E. Thus, as shown in FIG. 6F, the output Ⓕ from the adder 16 takes the frequency-divided value $n_0$ of the center frequency which becomes the count value of the counter 13.

During the next half cycle of the window pulse Ⓑ, as shown in FIG. 6C. the correction control pulse Ⓒ goes to high level "Hi" so that the AND gate 15 opens its gate to supply the value $n_1$ of the output Ⓓ from the digital low-pass filter 12 to the adder 16. Thus, as shown in FIG. 6F, the output Ⓕ from the adder 16 becomes ($n_0+n_1$) and the count value of the counter 13 is corrected in accordance with the phase of input data.

In the third and fourth half cycles of the window pulse Ⓑ, the correction control pulse Ⓒ again goes to "Lo" level so that the similar operation to that in the first half cycle is repeatedly performed.

Similarly, when the input data Ⓐ is supplied and the phase difference between the input data Ⓐ and the window pulse Ⓑ is measured as $n_2, n_3 \ldots$, the count value of the counter 13 is corrected on the basis of the measured phase difference only during the next half cycle of the window pulse Ⓑ.

The frequency-divided value $n_0$ of the center frequency is set to be, for example, 16 and the output $n_i$ from the digital low-pass filter 12 is selected so as to fall in a range of, for example, $-8 \leq n_i \leq 7$. Thus, in the case of 8-inch floppy disk with MFM mode in which the data rate is highest, in response to a clock frequency of 16 MHz, the frequency of the output Ⓑ from the counter 13 is controlled to fall in a range of 696 to 2000 kHz. Further, [7] is loaded in the counter 13 and then counted down. Thus, when the input data is supplied, if the count value of the counter 13 at that time is latched, this latched value presents the phase difference between the input data Ⓐ and the output Ⓑ from the counter 13.

When the interval of the input data is presented as 4.05T ($\approx 65$ clock cycles) and the output from the digital low-pass filter 12 becomes [1] similarly to FIG. 3, in this embodiment, as shown in FIGS. 7C and 7D, the count value of the counter 13 is corrected only in the next half cycle of the input data so that the data interval of 4.05T can be made equal to 65 clock cycles, thus the quantization error being reduced.

The practical circuit arrangement of the correction control pulse generating circuit 14 shown in FIG. 5 and the operation thereof will be described with reference to FIG. 8 forming a block diagram and FIGS. 9A to 9I forming timing charts.

Referring initially to FIG. 8, the input data Ⓐ supplied from the input terminal IN in FIG. 5 is supplied to a set terminal S of a RS-type flip-flop 141, and the Q output Ⓗ from the RS-type flip-flop 141 is supplied to a data input terminal D of a D-type flip-flop 142. A zero-detected output Ⓖ from the counter 13 is supplied to a data input terminal D of a D-type flip-flop 143 and this D-type flip-flop 143 receives at its clock input terminal CK the same clock Ⓙ as that supplied to the counter 13 (FIG. 5). The Q output Ⓘ from the D-type flip-flop 143 is supplied to the reset input terminal R of the RS-type flip-flop 141. The zero-detected output Ⓖ from the counter 13 is supplied to the clock input terminal CK of the D-type flip-flop 142 of which the Q output becomes the correction pulse Ⓒ.

The operation of the correction control pulse generator circuit 14 shown in FIG. 8 will be described next with reference to FIGS. 9A to 9I.

FIG. 9A illustrates a frequency-divided value Ⓕ (corresponding to Ⓕ in FIG. 5) of cycle T which is to be supplied to the counter 13. FIG. 9B illustrates the output Ⓖ from the counter 13. FIG. 9C illustrates the output Ⓔ in FIG. 5, i.e., the output from the AND gate 15. In this embodiment, the output $n_0$ is selected to be [15], and the output Ⓕ which results from adding [15] to the output Ⓔ from the AND gate 15 is loaded on the counter 13. Then, the counter 13 counts down in response to the input clock CK. The counter 13 incorporates zero-output detecting means though not shown. This zero output detecting means produces a pulse Ⓖ shown in FIG. 9D at timing in which the output from the counter 13 becomes zero. This pulse Ⓖ is supplied to the data input terminal D of the D-type flip-flop 143 which latches the value thereof in response to each clock Ⓙ shown in FIG. 9I. The Q output from the D-type flip-flop 143 becomes an output Ⓘ which is delayed from the pulse Ⓖ by one clock. Meanwhile, the RS-type flip-flop 141 is set by the input data Ⓐ shown in FIG. 9F and is reset by the above-mentioned output Ⓘ so that it produces the pulse Ⓗ shown in FIG. 9G. This pulse Ⓗ is supplied to the data input terminal Ⓓ of the D-type flip-flop 142, in which it is latched by the pulse Ⓖ. Thus, the D-type flip-flop 142 produces the Q output Ⓒ which goes to high level during the period corresponding to the cycle next to the cycle T in which the input data exists, as shown in FIG. 9H. This output Ⓒ is supplied to the AND gate 15 of FIG. 5 as a correction control pulse.

According to the present invention, as described above fully, since the correction control pulse is generated during the fundamental period succeeding to the fundamental period in which the input digital signal exists and the frequency-dividing ratio of the counter is controlled by the output from the digital low-pass filter only during this period, it is possible to reduce the quantization error, whereby the follow-up characteristic of the digital phase locked loop circuit of the invention can be improved.

Figure 10A:
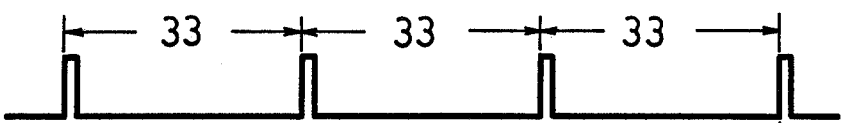
FIGS. 10A to 10D are timing charts respectively used to explain the operation of the embodiment shown in FIG. 5.
Figure 10B:
Figure 10C:
Figure 10D:
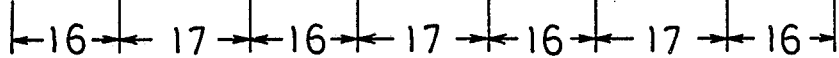

With the above-mentioned control system, the digital PLL circuit cannot avoid such a defect that while the PLL circuit is locked to the input data with ease, the residual phase error occurs. More specifically, when input data Ⓐ of which data cycle is equal to 33 clock cycles as shown in FIG. 10A, in other words, the input data Ⓐ having dc cycle fluctuation components of one clock cycle is supplied to the input terminal IN, in the measuring cycle in which the input data arrives at, the phase difference, [+1] between the input data Ⓐ the output pulse Ⓑ shown in FIG. 10B is measured. Thus, the digital low-pass filter 12 produces the output, [+1] as shown in FIG. 10C. In the following correction cycle, the frequency-dividing ratio of the counter 13 is corrected from [16] to [17] on the basis of the output [+1] as shown in FIG. 10D.

The similar operation is repeatedly effected hereinafter, then the sum of the measuring cycle and the correction cycle becomes equal to the cycle of the input data and hence, the PLL circuit 10A is locked to the input data. According to this control system, the phase error caused in the measuring cycle is used in the correction cycle so that the input data is generally employed. Should there be no phase difference [+1], the PLL circuit 10A could not be locked to the input data. Accordingly, as FIGS. 10A and 10B show, the phase error of one clock cycle remains in each data cycle. In other words, if the control operation is not effected under the state that the residual phase error is held, the PLL circuit 10A is no longer locked to the input data.

Similarly, when the cycle of the input data is [34] and there is a dc cycle fluctuation of 2 clock cycles, a phase error of 2 clocks remains.

With such a residual phase error, the capture range of the digital PLL circuit 10A is limited so that a range in which the PLL circuit can be used is also restricted.

In the following embodiment, a dc correcting circuit is provided to remove the above-mentioned residual phase error so that the PLL circuit of the invention can sufficiently cope with the dc cycle fluctuation of the input data.

Figure 11:
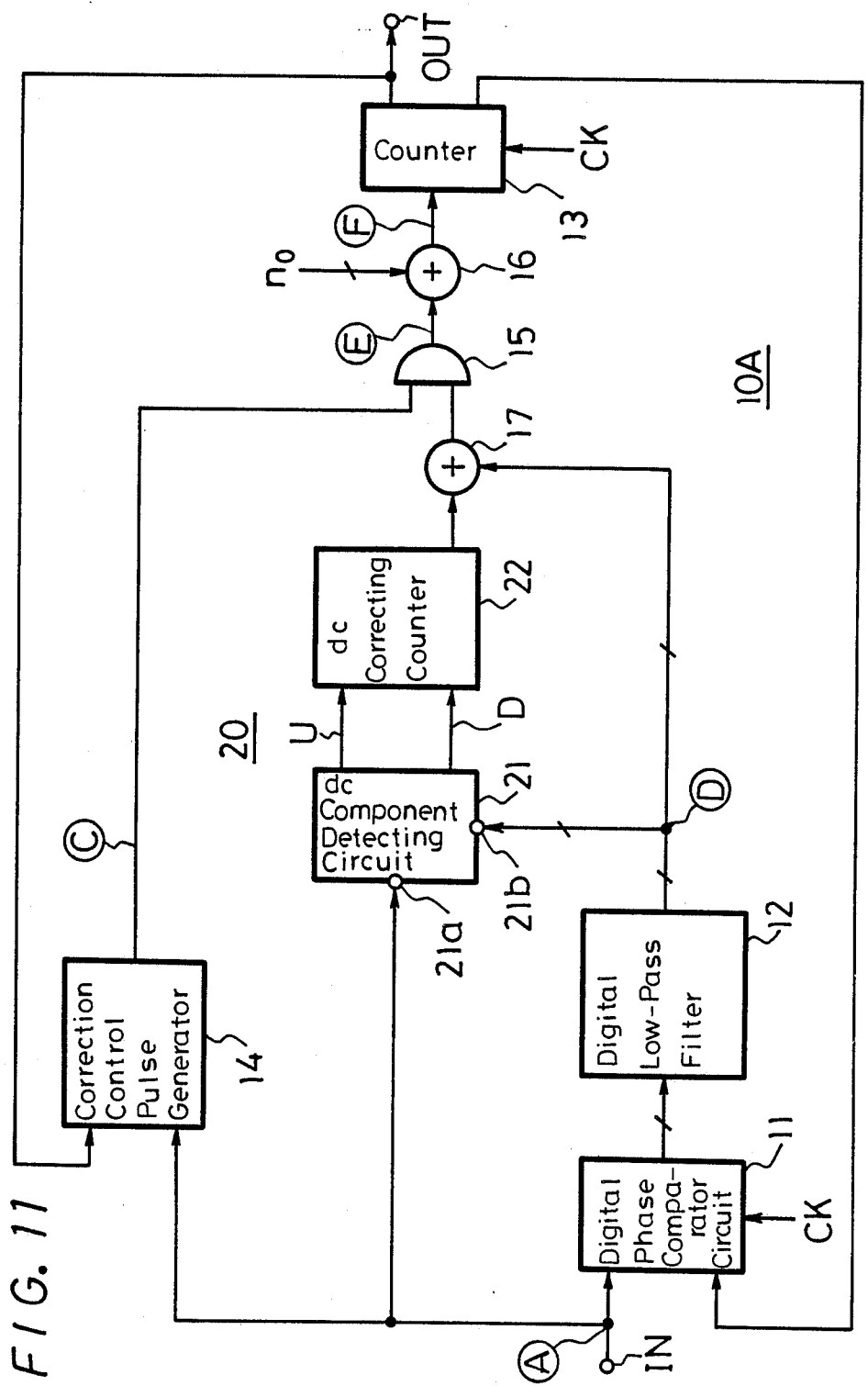
FIG. 11 is a block diagram showing a second embodiment of the digital phase locked loop circuit according to the present invention.

FIG. 11 illustrates a second embodiment of the present invention in which the dc correcting circuit is added. In FIG. 11, like parts corresponding to those of FIG. 5 are marked with the same references and therefore need not be described in detail.

In FIG. 11, reference numeral 20 generally designates a dc correcting circuit which comprises a dc component detecting circuit 21 and a dc correcting counter 22. Input data Ⓐ from the input terminal IN and the output Ⓓ from the digital low-pass filter 12 are supplied to input terminals 21a and 21b of the dc component detecting circuit 21, respectively. A pair of outputs U and D from the dc component detecting circuit 21 are supplied to the dc correcting counter 22. The output from this dc correcting counter 22 is supplied to an adder 17 and is thereby added to the output Ⓓ from the digital low-pass filter 12.

FIG. 12 illustrates the arrangement of the dc correcting circuit 20 in greater detail. Referring to FIG. 12, input data and a phase error signal from the terminals 21a and 21b are respectively supplied to a 3-bit counter 23 and a phase error polarity judging circuit 24. A pair of outputs from the phase error polarity judging circuit 24 are respectively supplied to an up terminal U and a down terminal D of a up-down counter 25, while the output from the 3-bit counter 23 is supplied to the clear terminal CLR of the up-down counter 25. The output from the up-down counter 25 is supplied to a magnitude judging circuit 26, and a pair of outputs from the magnitude judging circuit 26 are respectively supplied through AND gates 27U and 27D to the dc correcting counter 22. The output from he dc correcting counter 22 is supplied to the adder 17 (see FIG. 11) and to an upper and lower limiter 28. The output from the limiter 28 is supplied to both the AND gates 27U and 27D.

The operation of the dc correcting circuit 20 shown in FIG. 12 will be described. When input data Ⓐ shown in FIG. 13A is supplied from the input terminal 21a to the 3-bit counter 23, it produces a clear pulse Ⓑ shown in FIG. 13B at every eight input data. On the basis of this clear pulse Ⓑ, the up-down counter 25 clears its count value to "0" as shown in FIG. 6E.

When the input data Ⓐ is not subjected to any dc cycle fluctuation, the output from the phase comparator circuit 11 (see FIG. 11) changes its polarity to positive and negative polarities with less fluctuation as shown in FIG. 13C. This output from the phase comparator circuit 11 is supplied through the digital low-pass filter 12 (see FIG. 11) and the input terminal 21b to the phase error polarity judging circuit 24. Then, in response to the positive or negative polarity of the phase error, an up signal UP and a down signal DN or D shown in FIG. 13D are respectively supplied from the judging circuit 24 to the input terminals U and D of the up-down counter 25. Thus, a value Ⓔ of the counter 25 is repeatedly increased and decreased as shown in FIG. 13E.

The count value Ⓔ of the up-down counter 25 is compared with a predetermined value and the magnitude thereof is judged by the magnitude judging circuit 26 immediately before the next clear pulse Ⓑ as shown in FIG. 10E.

In this embodiment, when the input is more than [5], the magnitude judging circuit 26 produces at its one output terminal 26a a pulse, while when the input is less than [−5], the magnitude judging circuit 26 produces at its other output terminal 26b a pulse. In the case of FIG. 13, since the count value [4] of the up-down counter 25 is supplied to the magnitude judging circuit 26, as shown in FIG. 13F, this magnitude judging circuit 26 produces no pulse at its output terminals 26a and 26b. Thus, as shown in FIG. 13G, the count value of the dc correcting circuit 22, i.e., the output from the dc correcting circuit 20 stays [0].

When the input data Ⓐ is dc-cycle-fluctuated, the output from the digital phase comparator circuit 11 (see FIG. 11) urges its polarity toward positive side as shown, for example, in FIG. 14C. This displaced phase error signal Ⓒ is supplied to the phase error polarity judging circuit 24 from the terminal 21b, the circuit 24 continuously produces the up signal UP as the output Ⓓ as shown in FIG. 14D. Thus, as shown in FIG. 14E, the count value Ⓔ of the up-down counter 25 is gradually increased and reaches [7] just before the next clear pulse Ⓑ.

The magnitude judging circuit 26 receives the count value [7] of the up-down counter 25 and produces at its one output terminal 26a a pulse as shown in FIG. 14F. This output pulse is supplied through the AND gate 27U to the up terminal U of the dc correcting counter 22, whereby as shown in FIG. 14G, the count value of the dc correcting counter 22 is incremented from [0] to [1].

The adding circuit 17 shown in FIG. 11 adds the corrected value [1] of the counter 22 and the residual phase error of the digital low-pass filter 12, while the adder 16 adds the above-mentioned added value and the center frequency-divided value [n₀] thereby to correct the frequency-dividing ratio of the counter 13 (see FIG. 11).

The upper and lower limiter 28 in FIG. 12 is adapted to prevent the dc correcting circuit 20 from running recklessly. That is , when the count value of the dc correcting counter 22 is varied beyond, for example, [+3], the limiter 28 supplies a low level output "Lo" to the AND gate 27U, while when the count value is varied beyond, for example, [−3], the limiter 28 supplies a low level output "Lo" to the other AND gate 27D so that the value of the dc correcting counter 22 is controlled to fall in a predetermined range.

When supplied with input data having dc cycle fluctuation of one clock cycle as shown in FIG. 15A, the digital PLL circuit 10A of this embodiment keeps containing phase error of one clock cycle until the dc correcting circuit 20 produces the correcting output, as shown in FIG. 10.

When the dc correcting circuit 20 produces the correcting value [1] as described above, in the initial measuring cycle, this correcting value [1] is added to the phase error value [1] as shown in FIG. 15C. Thus, in the first correcting cycle, as shown in FIG. 15D, the frequency-dividing ratio of the counter 13 (see FIG. 11) becomes 16+1+1=18 with the result that as shown in FIGS. 15A and 15B, in the second measuring cycle, the phase error between the input data Ⓐ and the pulse Ⓑ of the VCO becomes [0]. At that time, as shown in FIG. 15C, the dc correcting circuit 20 maintains the correcting value [1] so that as shown in FIG. 15D, the frequency-dividing ratio of the counter 13 in the second correcting cycle becomes 16+1 =17. Also in the third measuring cycle, as shown in FIGS. 15A and 15B, the phase error between the input data Ⓐ and the VCO pulse Ⓑ becomes [0].

The similar operation is repeatedly effected hereinafter, whereby the digital PLL circuit 10A shown in FIG. 11 is locked to input data having dc cyclic fluctuation without residual phase error, thus making it possible to enlarge the capture range of the digital PLL circuit.

The second embodiment of the digital PLL circuit having the dc correcting circuit according to the present invention will be described next.

FIG. 16 generally illustrates a recording format of the floppy disk. On this recording format, as FIG. 16 shows, a synchronizing area is provided in front of data area of each sector so that a digital PLL circuit at the reproduction side can be synchronized with data reproduced from the floppy disk with ease. By way of example, in this synchronizing area, there is recorded data of a predetermined bit pattern (101010 . . . 10) of the length, 12 bytes=96 bits. The second embodiment of the invention makes effective use of data recorded in the afore-mentioned synchronizing area.

FIG. 17 illustrates an overall arrangement of the second embodiment. In FIG. 17, like parts corresponding to those of FIG. 5 are marked with the same references and therefore need not be described in detail.

As FIG. 17 shows, in the digital PLL circuit 10A, there is provided a dc correcting circuit 200 which comprises a synchronizing area detecting circuit 121 and a dc latch circuit 122. The synchronizing area detecting circuit 121 receives at its input terminals 121a and 121b input data from the input terminal IN and the window signal from the counter 13, respectively. The output from the digital low-pass filter 12 is supplied to the dc latch circuit 122 and the detected output from the synchronizing area detecting circuit 121 is supplied to the dc latch circuit 122 as a latch signal. The latched output from the dc latch circuit 122 is supplied to the adder 17 and is thereby added to the output from the digital low-pass filter 12.

The arrangement of the dc correcting circuit 200 will be described more fully with reference to a block diagram forming FIG. 18. Referring to FIG. 18, input data at the input terminal 121a and the window signal at the input terminal 121b are supplied to a data reproducing circuit 123 and the output from the data reproducing circuit 123 is supplied to a 16-bit shift register 124. The window signal from the terminal 121b is supplied to the shift register 124 as a clock. The output from the shift register 124 is supplied to a synchronizing pattern detecting circuit 125, and the output from the synchronizing pattern detecting circuit 125 is supplied to the dc latch circuit 122 as a latch signal. In this case, the data reproducing circuit 123 may be served as the afore-mentioned data separator circuit.

The operation of the dc correcting circuit 200 in FIG. 18 will be described next.

When the digital PLL circuit 10A is locked to the synchronizing pattern as described hereinabove, as shown in FIGS. 19A and 19B, a phase relationship between the input data and the first output from the counter 13 (see FIG. 17), i.e., VCO pulse becomes constant. When the counter 13 supplies the window pulse shown in FIG. 19C through the input terminal 121b to the data reproducing circuit 123, in response to the MFM-modulated synchronizing pattern such as 1010 . . . shown in FIG. 19A, the data reproducing circuit 123 produces reproduced data, 1010 . . . as shown in FIG. 19D. This reproduced data is supplied through the 16-bit shift register 124 to the sync. pattern detecting circuit 125. At time point in which the detecting circuit 125 detects the synchronizing pattern of 16 bits such as 10 10 10 . . . 10, the synchronizing pattern detecting circuit 125 directly supplies a latch signal shown in FIG. 19E to the dc latch circuit 122, thus latching the phase error at that time point.

When data of synchronizing pattern shown in FIG. 20A is supplied to the digital PLL circuit 10A shown in FIG. 17, the value of phase error is fluctuated to positive or negative side as shown in FIG. 20B (−7 or the like in the figure represents negative number) until the digital PLL circuit 10A is locked to the input data.

At the completion of the locking operation of the digital PLL circuit 10A to the input data, the phase error becomes a constant value as earlier described. When the input data contains a dc cycle fluctuation component, as illustrated in FIG. 20B, the phase error of, for example, [1] remains. When the synchronizing area is detected by the synchronizing area detecting circuit 121 as described hereinabove, in this embodiment, the phase error [1] is regarded as a dc cycle fluctuation component of the input data. This dc component is latched by the latch signal shown in FIG. 20C in the dc latch circuit 122.

Thereafter, as shown in FIG. 20D, the output from the dc latch circuit 122 is increased from [0] to [1].

The adding circuit 17 adds the corrected value [1] of the latch circuit 122 and the residual phase error obtained from the digital low-pass filter 12, while the adder 16 adds the added value and the center frequency-divided value [n₀] thereby to correct the frequency-dividing ratio of the counter 13.

When supplied with the input data having the dc cycle fluctuation component of one clock cycle shown in FIG. 15A, the digital PLL circuit 10A of the embodiment shown in FIG. 17 keeps containing the phase error of one clock cycle until the dc correcting circuit 200 produces the corrected output.

When the dc correcting circuit 200 produces the corrected value [1] as described above, in the first measuring cycle, this corrected value is added to the phase error value [1] as shown in FIG. 15C. Thus, in the first correcting cycle, as shown in FIG. 15D, the frequency-dividing value of the counter 13 becomes $16+1+1=18$, so that as shown in FIGS. 15A and 15B, in the second measuring cycle, the phase error between the input data and the VCO pulse becomes zero. At that time, as shown in FIG. 15C, the corrected value [1] of the dc correcting circuit 200 is maintained so that as shown in FIG. 15D, the frequency-dividing value of the counter 13 in the second correcting cycle is presented as $16+1=17$. Also in the third measuring cycle, the phase error between the input data and the VCO pulse becomes zero as shown in FIGS. 15A and 15B.

The similar operation is repeatedly performed hereinafter. Thus, the digital PLL circuit 10A shown in FIG. 17 can be locked to the input data having the dc cycle fluctuation component without any residual phase error, thus making it possible to widen the capture range thereof.

Figure 22:
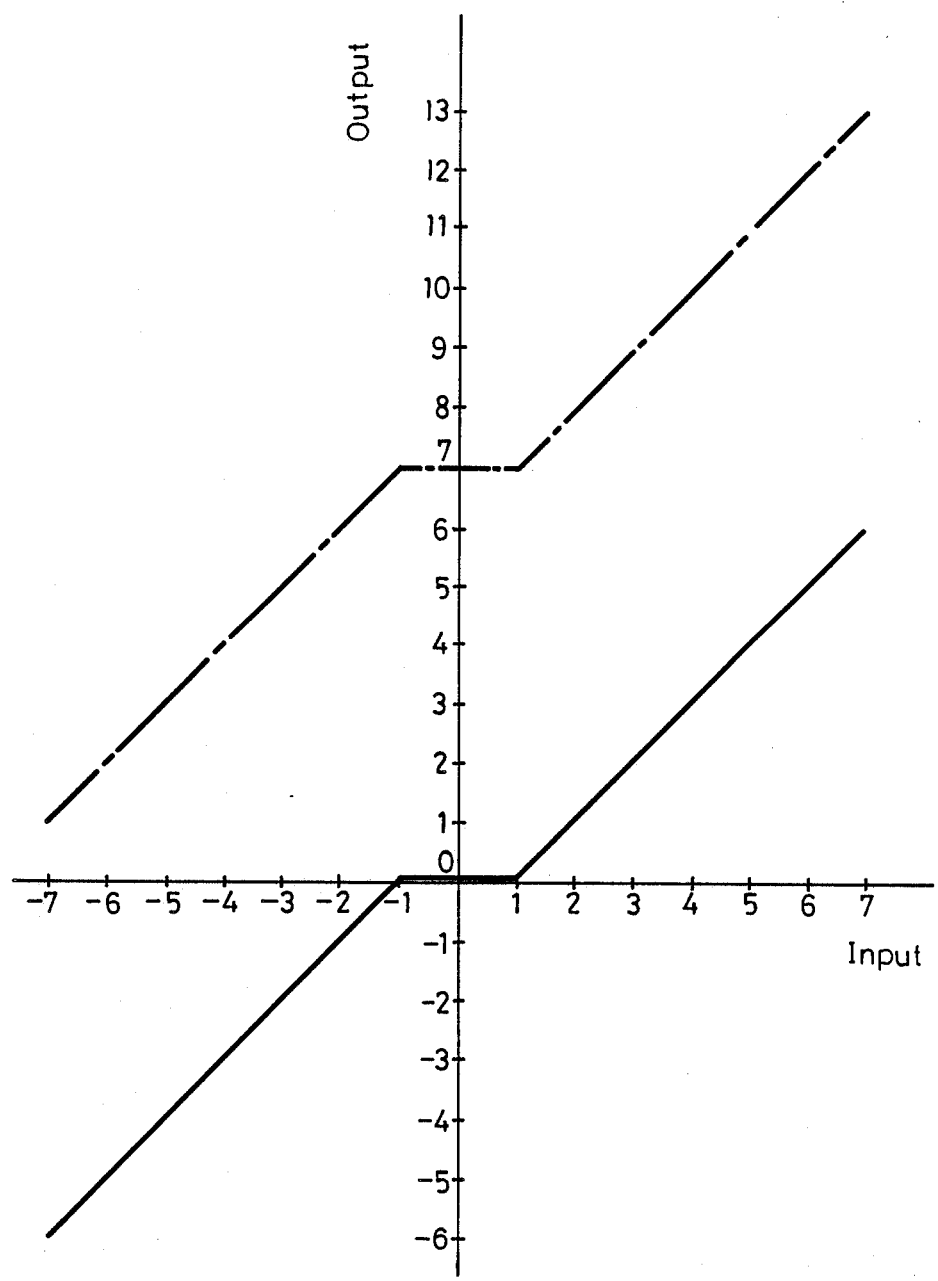
FIG. 22 is a characteristic graph used to explain the operation of the fourth embodiment of the present invention.

Referring to FIGS. 21 to 23, let us now explain other embodiment of the digital PLL circuit according to the present invention. In this embodiment, the digital PLL circuit is arranged so as not to follow a frequency fluctuation component of high frequency such as a peak shift or the like. FIG. 21 illustrates an overall circuit arrangement of this embodiment. In FIG. 21, like parts corresponding to those of FIG. 5 are marked with the same references and the overlapping explanation therefor will not be made.

Referring to FIG. 21, there is shown the digital PLL circuit 10A of this embodiment. In the digital PLL circuit 10A, a non-linear conversion circuit including a ROM (read only memory) 30 is provided between the digital low-pass filter 12 and one input terminal of the AND gate 15, and the output from the non-linear conversion circuit 30 is supplied through the AND gate 15 and the adder 16 to the counter 13. The adder 16 is also supplied with the frequency-divided value $n_0$ ($=16$) of the center frequency by which the output from the counter 13 becomes a center frequency in the absence of input data. Other arrangements are similar to those of FIG. 5.

Now, the operation of this embodiment will be described. The input vs. output characteristic of the non-linear conversion circuit 30 is determined in such a fashion that as, for example, shown by a solid line in FIG. 22, the output becomes [0] for the input in a range of $[-1]$ to $[+1]$.

Similarly to the above-mentioned example of the prior art shown in FIG. 4, input data having a high frequency fluctuation component by the peak shift shown in FIG. 23A is supplied to the input terminal IN and the output from the digital phase comparator circuit 11, which is changed as [0], $[-5]$, [0] and $[+5]$, is supplied to the digital low-pass filter 12. When the phase error of $[+5]$ due to the measuring error is supplied to the digital low-pass filter 12, as shown in FIG. 23D, [1] appears in the output from the digital low-pass filter 12. This output $[+1]$ is supplied to the non-linear conversion circuit 30. In this embodiment, the operations of the correction pulse generating circuit 14 and the AND gate 15 may be neglected. Since the non-linear conversion circuit 30 has the input vs. output characteristic shown by the solid line in FIG. 22 as described hereinbefore, for the input data, $[+1]$, the output from the non-linear conversion circuit 30 becomes [0] as shown in FIG. 23E. Therefore, as FIG. 23F shows, the output from the adder 16 becomes the center frequency frequency-divided value $[n_0]$ which forms the value of the counter 13.

In accordance with teaching of this embodiment shown in FIG. 21, the measuring error of the digital low-pass filter 12 can be absorbed and removed by the non-linear conversion circuit 30. Hence, the digital PLL circuit 10A can be prevented from being fluctuated recklessly and the stability of the digital PLL circuit 10A ca be improved.

When the input data and the clock of the data separator circuit are not synchronized with each other, due to the quantization error caused when the digital phase comparator circuit samples the input data by the reference clock, the output from the digital low-pass filter does not become [0] even though the input data and the output signal from the PLL circuit have no phase difference therebetween. Also in this case, with the employment of the non-linear conversion circuit, the quantization error can be absorbed and removed so that the follow-up characteristic of the digital PLL circuit of the invention can be improved.

Furthermore, by determining the characteristic of the non-linear conversion circuit as shown by a one-dot chain line in FIG. 22, it is possible to offset the output including the dead zone.

The above description is presented by way of example on the preferred embodiments of the invention and it will be apparent that many modifications and variations thereof could be effected by one with ordinary skill in the art without departing from the spirit and scope of the novel concepts of the invention so that the scope of the invention should be determined only by the appended claims.

We claim as our invention:

1. A digital phase locked loop (PLL) circuit comprising:
   (a) input digital signal source means for generating an input digital signal having a pulse occurring at an integral multiple of a unit period;
   (b) counter means for counting the number of a reference clock;
   (c) digital phase comparator means for comparing phases of said input digital signal and the output of said counter means;
   (d) digital low-pass filter means supplied with the output of said digital phase comparator means;
   (e) correction control signal generating means for generating a correction control signal occurring at a following unit period of a unit period during which the pulse of said input digital signal occurs; and
   (f) control means in response to said correction control signal for supplying the output of said digital low-pass filter means to said counter means to control the dividing ratio of said counter means only in the unit period during which said correction control signal is obtained.

2. A digital phase locked loop circuit according to claim 1, wherein said input digital signal is an MFM signal and the pulse occurs at 2, 3 or 4 times of the unit period, said unit period being half of a source data period.

3. A digital phase locked loop circuit according to claim 1, wherein said control means includes AND gate means supplied with the correction control signal and the output of said digital low-pass filter means.

4. A digital phase locked loop circuit according to claim 3, wherein said control means further includes adder means for adding the output of said AND gate means and a predetermined number, the output of said adder means being supplied to said counter means.

5. A digital phase locked loop circuit according to claim 1, wherein said correction control signal generating means is controlled by said input digital signal, the output of said counter means and said reference clock.

6. A digital phase locked loop circuit according to claim 5, wherein said correction control signal generating means includes a first D-type flip-flop having a data input terminal supplied with the output of said counter means, a clock input terminal supplied with the reference clock and at least one output terminal at which a first output is obtained, a first RS-type flip-flop having a set terminal supplied with the input digital signal, a reset terminal supplied with said first output and at least one output terminal at which a second output is obtained, and a second D-type flip-flop having a data input terminal supplied with said second output, a clock terminal supplied with the output of said counter means and at least one output terminal at which s id correction control signal is obtained.

7. A digital phase locked loop circuit according to claim 1, further comprising DC correcting circuit means supplied with the output of said digital low-pass filter means and for generating a DC correcting signal combined with the output of said digital low-pass filter means.

8. A digital phase locked loop circuit according to claim 7, wherein said DC correcting circuit means includes DC component detecting means for detecting the DC component of the output of said digital low-pass filter means, and DC correcting counter means supplied with the output of said DC component detecting means and for generating said DC correcting signal.

9. A digital phase locked loop circuit according to claim 8, wherein said DC component detecting means includes polarity detecting means for detecting the polarity of the output of said digital low-pass filter mean and first counter means controlled by the output of said polarity detecting means, and said DC correcting counter means includes comparator means for comparing the output of said first counter means and a predetermined value and second counter means controlled by the output of said comparator means and for generating said DC correcting signal.

10. A digital phase locked loop circuit according to claim 7, wherein said DC correcting circuit means includes digital latch circuit means for latching the output of said digital low-pass filter means and latch pulse generating means for generating a latch pulse supplied to said digital latch circuit means.

11. A digital phase locked loop circuit according to claim 10, wherein said latch pulse generating means includes synchronizing pattern detecting means for detecting a synchronizing pattern of said input digital signal and of generating said latch pulse.

12. A digital phase locked loop circuit according to claim 1, wherein said digital low-pass filter means includes non-linear conversion means for converting the output of said digital low-pass filter means in a non-linear fashion such that the output of said digital low-pass filter means with a value less than a predetermined level is clipped to a reference level.

13. A digital phase locked loop circuit according to claim 12, wherein said non-linear conversion means includes read only memory means.

* * * * *